United States Patent
Truninger et al.

(10) Patent No.: US 7,378,030 B2
(45) Date of Patent: May 27, 2008

(54) FLEXTENSIONAL TRANSDUCER AND METHOD OF FORMING FLEXTENSIONAL TRANSDUCER

(75) Inventors: Martha A. Truninger, Corvallis, OR (US); Charles C. Haluzak, Corvallis, OR (US); Steven Leith, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 361 days.

(21) Appl. No.: 11/041,773

(22) Filed: Jan. 24, 2005

(65) Prior Publication Data

US 2005/0157096 A1 Jul. 21, 2005

Related U.S. Application Data

(62) Division of application No. 10/348,384, filed on Jan. 21, 2003, now Pat. No. 6,883,903.

(51) Int. Cl.
*G01D 15/00* (2006.01)
*G11B 5/127* (2006.01)

(52) U.S. Cl. .................. 216/27; 29/890.1; 438/21

(58) Field of Classification Search .......... 216/27; 438/21; 29/890.1; 347/20, 54, 56, 68, 71, 347/72
See application file for complete search history.

(56) References Cited

U.S. PATENT DOCUMENTS

| | | | |
|---|---|---|---|
| 5,124,717 A | | 6/1992 | Campanelli et al. |
| 5,141,596 A | | 8/1992 | Hawkins et al. |
| 5,324,683 A | * | 6/1994 | Fitch et al. .............. 438/422 |
| 5,387,314 A | | 2/1995 | Baughman et al. |
| 5,565,084 A | * | 10/1996 | Lee et al. .............. 205/646 |
| 5,759,870 A | * | 6/1998 | Yun et al. .............. 438/53 |
| 5,828,394 A | | 10/1998 | Khuri-Yakub et al. |
| 5,870,123 A | | 2/1999 | Lorenze, Jr. et al. |
| 5,876,497 A | | 3/1999 | Atoji |
| 6,000,787 A | | 12/1999 | Weber et al. |
| 6,008,138 A | | 12/1999 | Laermer et al. |
| 6,010,461 A | | 1/2000 | Haniff et al. |
| 6,045,710 A | | 4/2000 | Silverbrook |
| 6,074,890 A | * | 6/2000 | Yao et al. .............. 438/52 |

(Continued)

FOREIGN PATENT DOCUMENTS

EP 0978832 A2 2/2000

(Continued)

OTHER PUBLICATIONS

Percin et al., Micromachined 2-D Array Piezoelectrically Actuated Flextensional Transducers: New Designs. SPIE Conference, Sep. 1998; SPIE vol. 3514, pp. 411-414.

(Continued)

*Primary Examiner*—Roberts Culbert

(57) ABSTRACT

A method of forming an opening through a substrate having a first side and a second side opposite the first side includes forming a trench in the first side of the substrate, forming a mask layer within the trench, filling the trench with a fill material, forming a first portion of the opening in the substrate from the second side of the substrate toward the mask layer, and forming a second portion of the opening in the substrate through the mask layer and the fill material, including communicating the second portion of the opening with the first portion of the opening and the first side of the substrate.

30 Claims, 15 Drawing Sheets

U.S. PATENT DOCUMENTS

| | | | |
|---|---|---|---|
| 6,096,656 A | | 8/2000 | Matzke et al. |
| 6,139,761 A | | 10/2000 | Ohkuma |
| 6,143,190 A | * | 11/2000 | Yagi et al. ............... 216/27 |
| 6,234,608 B1 | | 5/2001 | Genovese et al. |
| 6,245,247 B1 | * | 6/2001 | Silverbrook ............... 216/27 |
| 6,291,927 B1 | | 9/2001 | Percin et al. |
| 6,305,080 B1 | | 10/2001 | Komuro et al. |
| 6,388,304 B2 | | 5/2002 | Matsuoka et al. |
| 6,474,795 B1 | | 11/2002 | Lebens et al. |
| 6,475,402 B2 | | 11/2002 | Nordstrom et al. |

FOREIGN PATENT DOCUMENTS

| | | |
|---|---|---|
| EP | 0841167 A3 | 3/2000 |
| EP | 0655334 B2 | 6/2002 |
| GB | 2245366 A | 1/1992 |
| WO | WO 97/12689 | 4/1997 |
| WO | WO 00/23376 | 4/2000 |

OTHER PUBLICATIONS

Percin et al., Micromachined Two-Dimensional Array Piezoelectrically Actuated Transducers. Applied Physics Letters, vol. 72, No. 11, Mar. 16, 1998, pp. 1397-1399.

Percin et al., Micromachined 2-D Array Piezoelectrically Actuated Flextensional Transducers and Inkjet Print Heads. Electrochemical Society Proceedings vol. 98-14, pp. 87-93, 1998.

Percin, G., Micromachined Piezoelectrically Actuated Flextensional Transducers for High Resolution Printing and Medical Imaging, 1999, pp. 1-23.

Percin et al., Micromachined 2-D Array Piezoelectrically Actuated Flextensional Transducers. 1997 IEEE Ultrasonics Symposium, pp. 959-962.

n

* cited by examiner

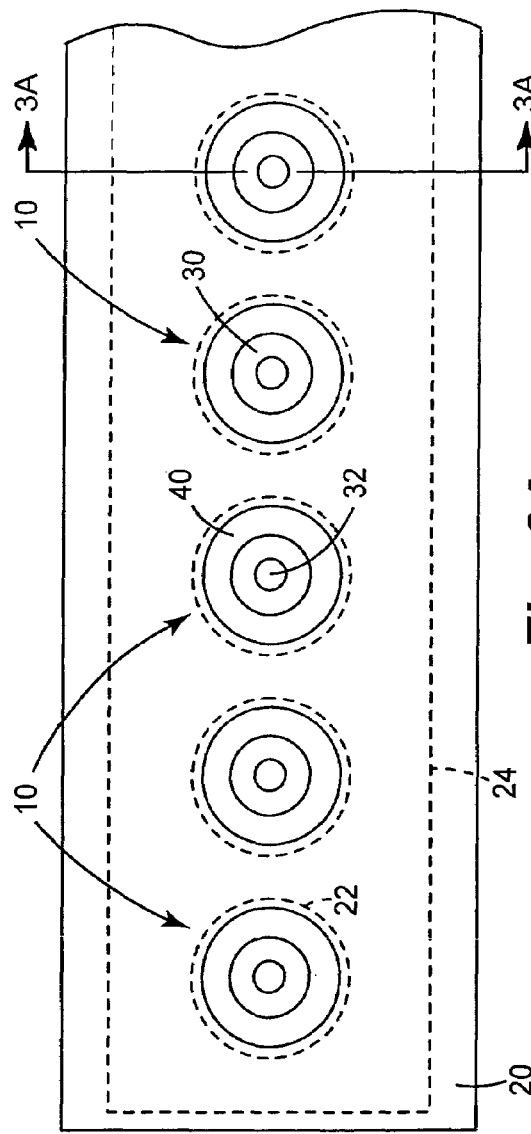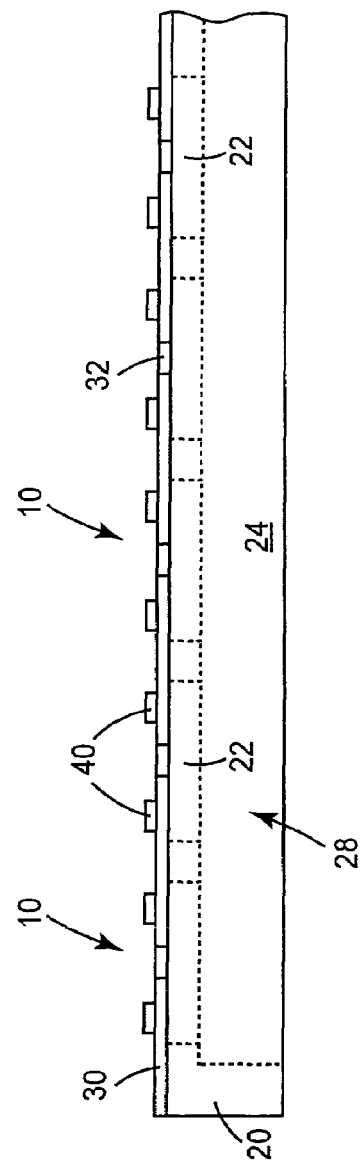

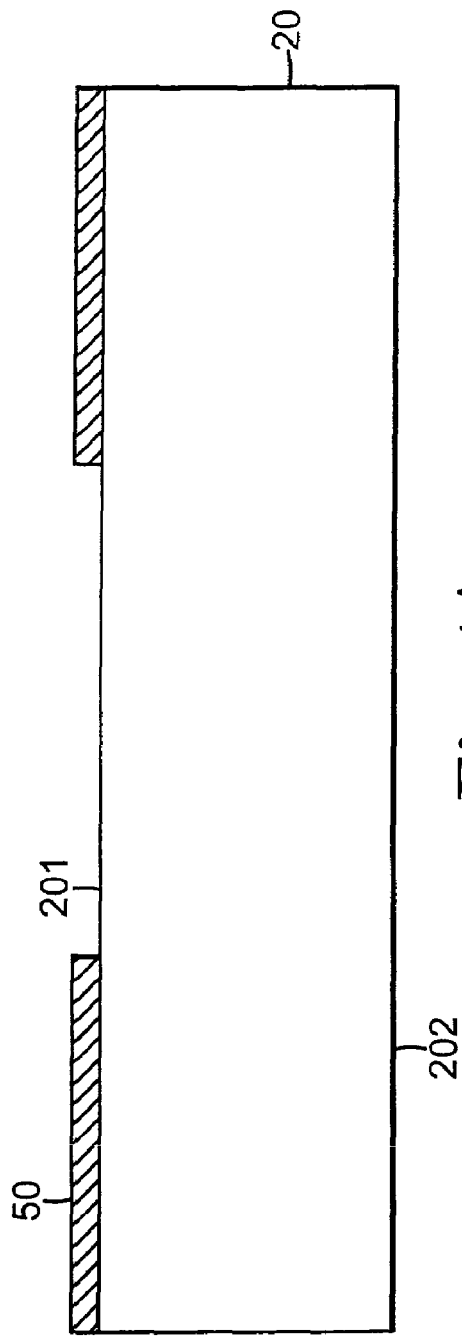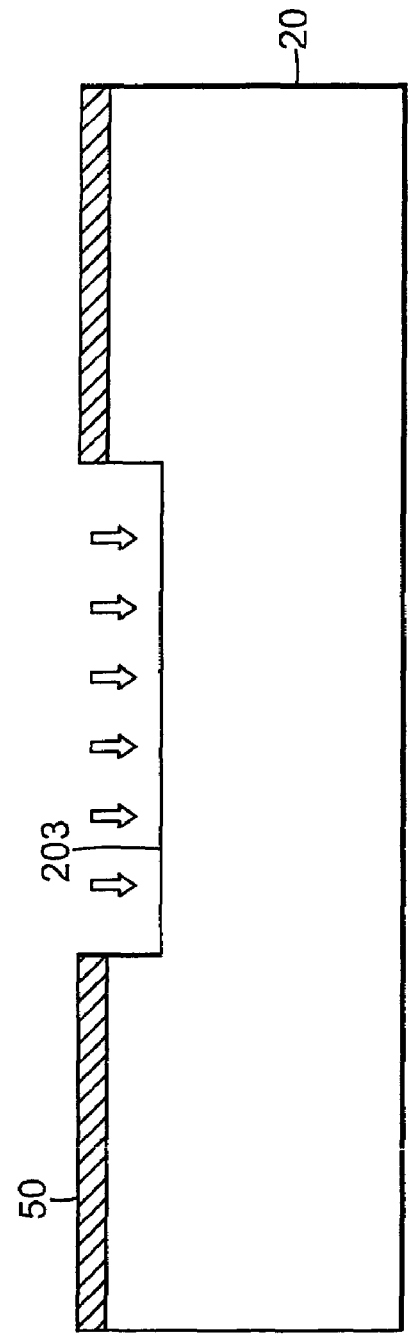

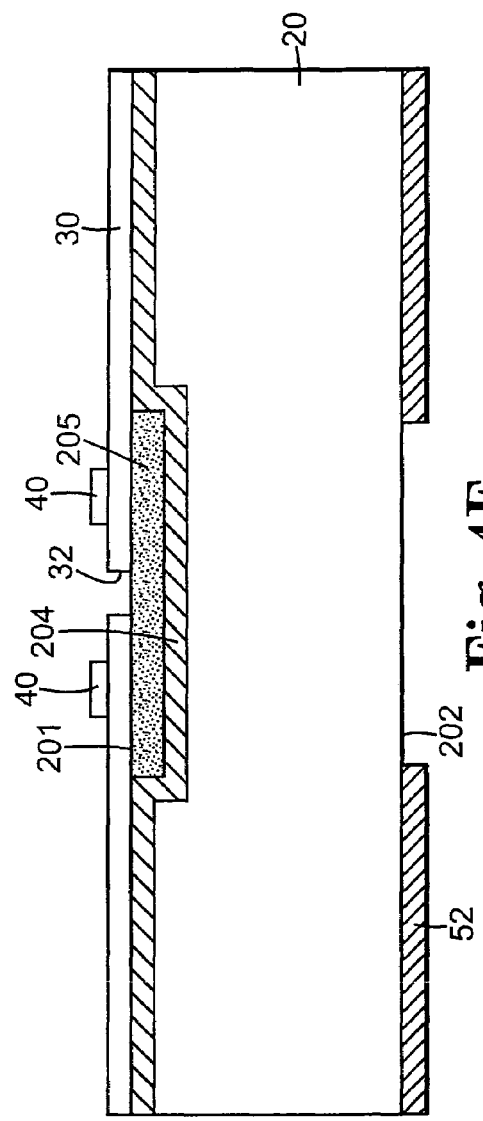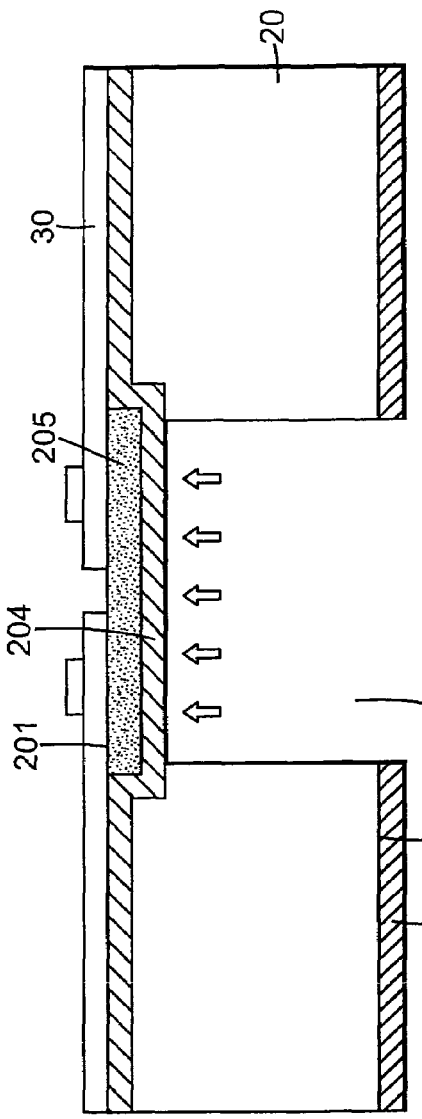

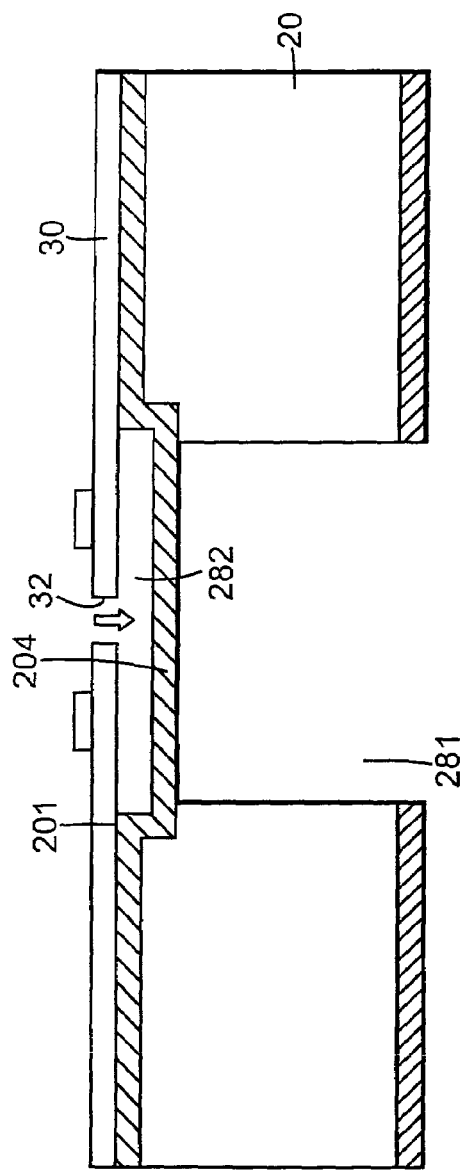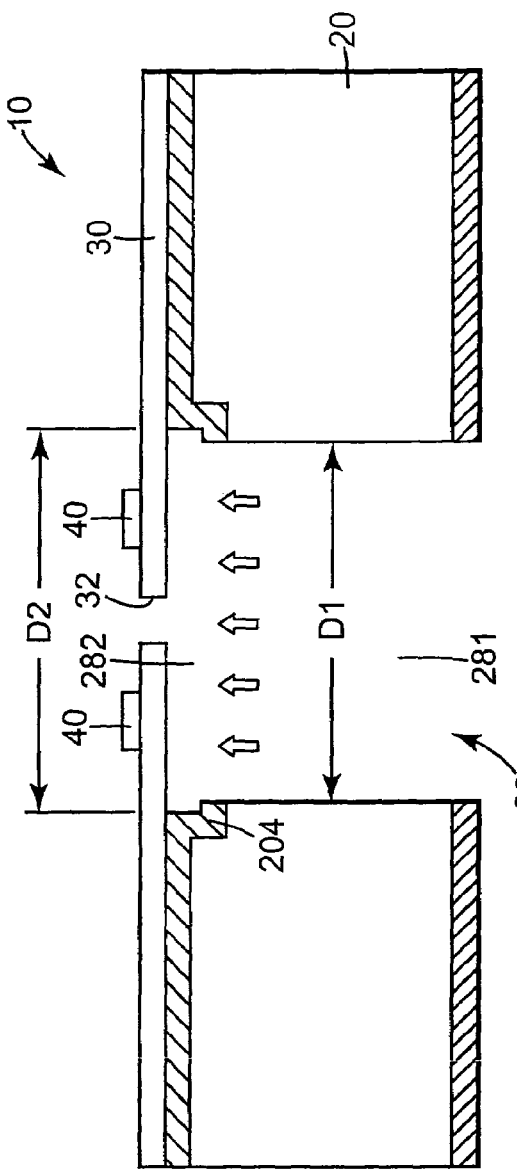

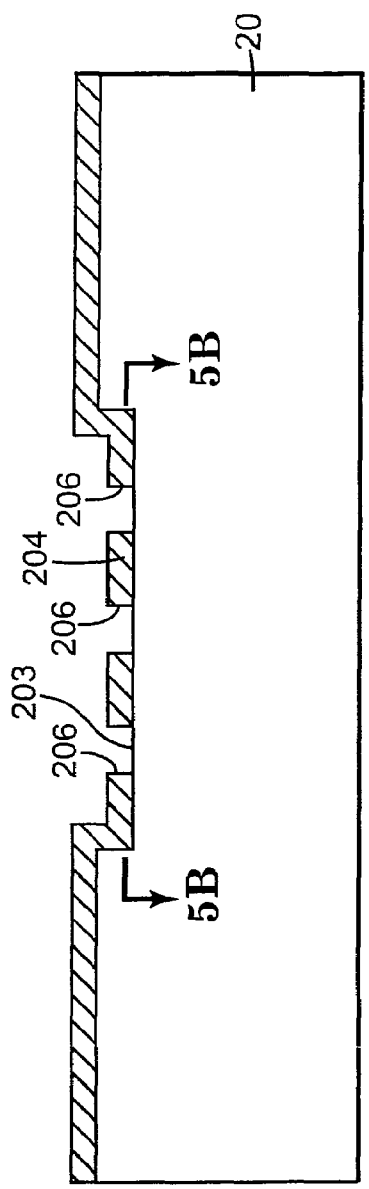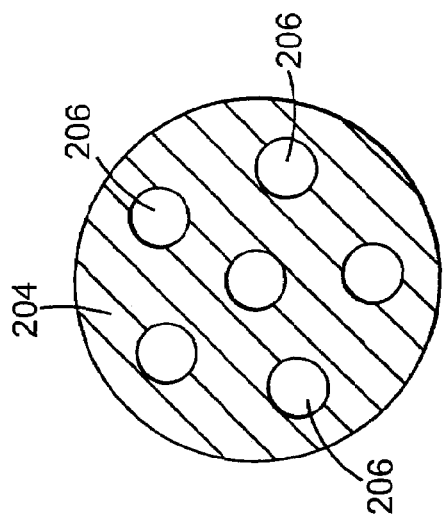
Fig. 5A
Fig. 5B

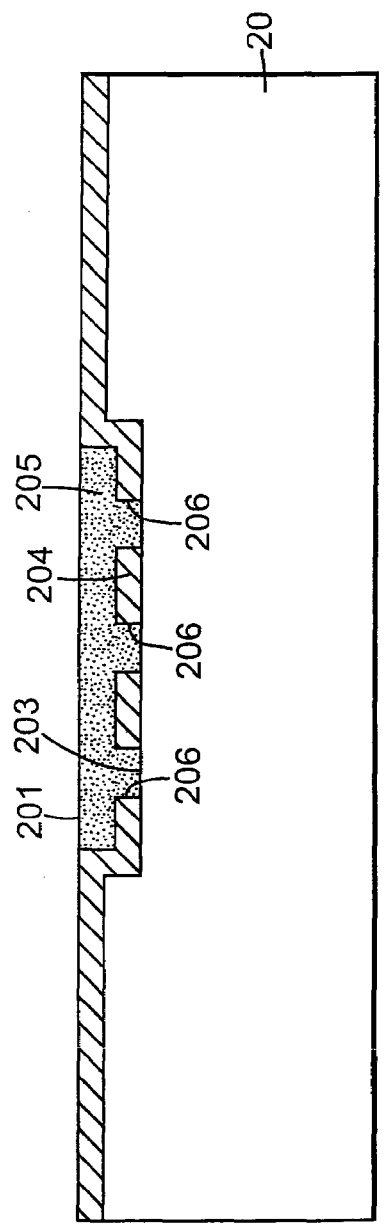
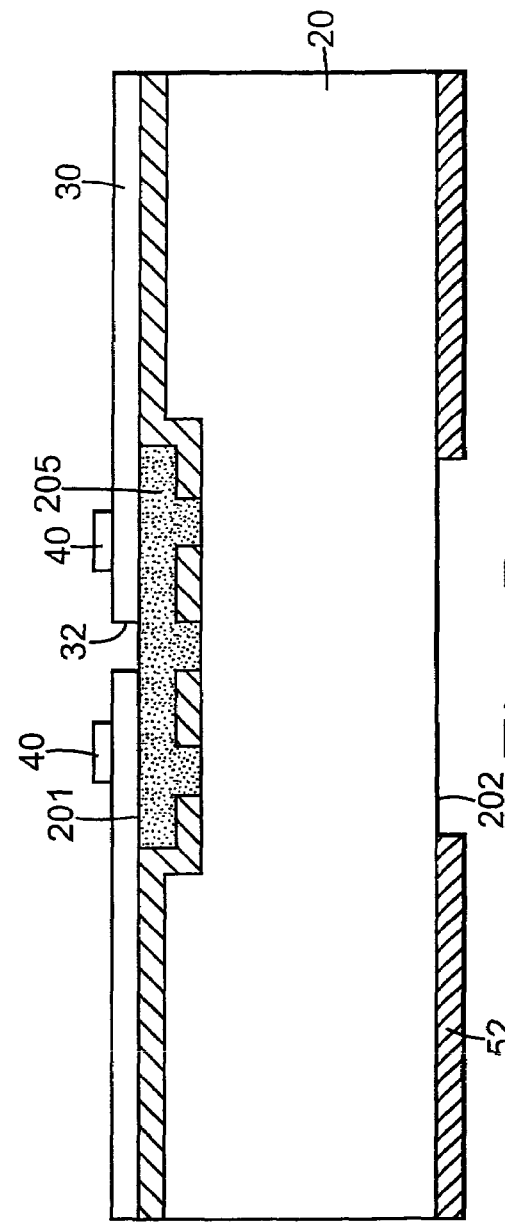
Fig. 5C
Fig. 5D

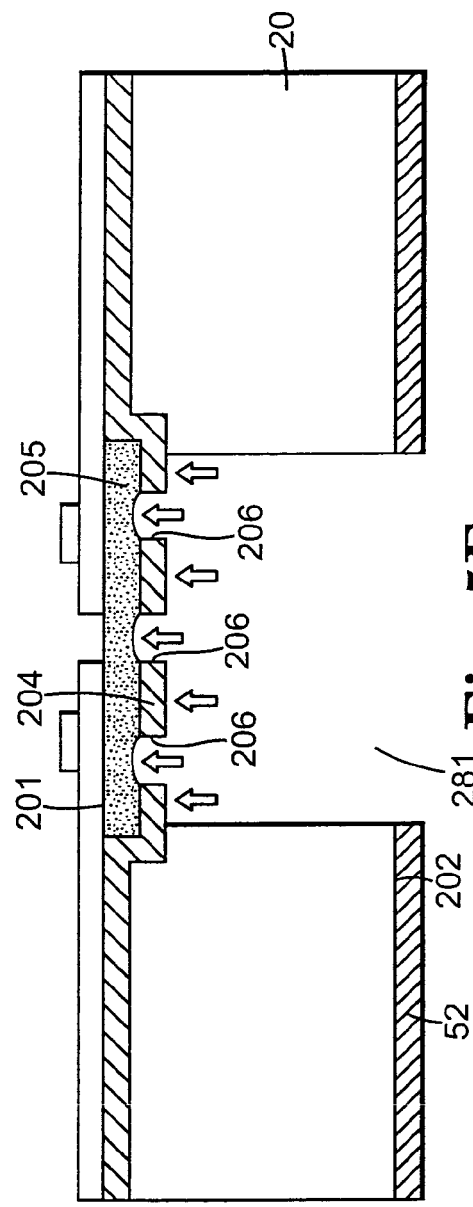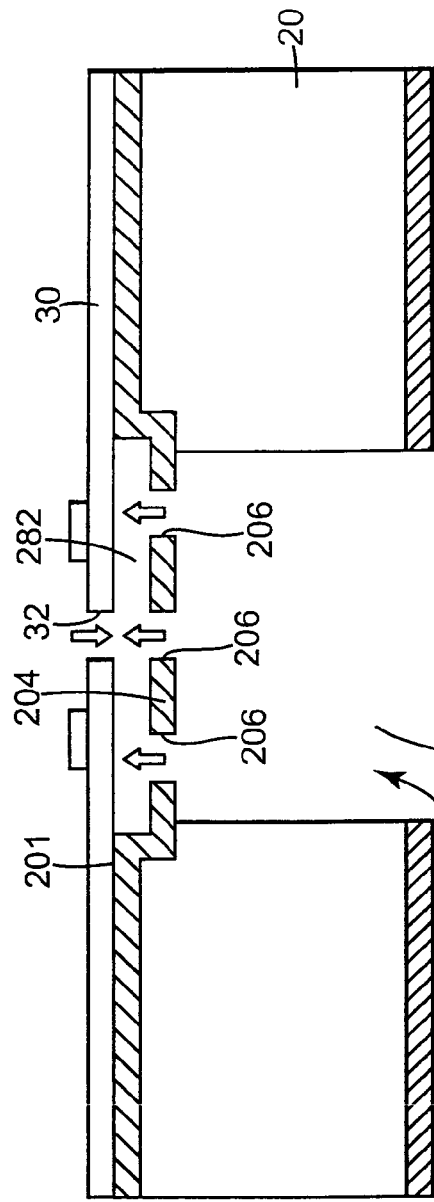

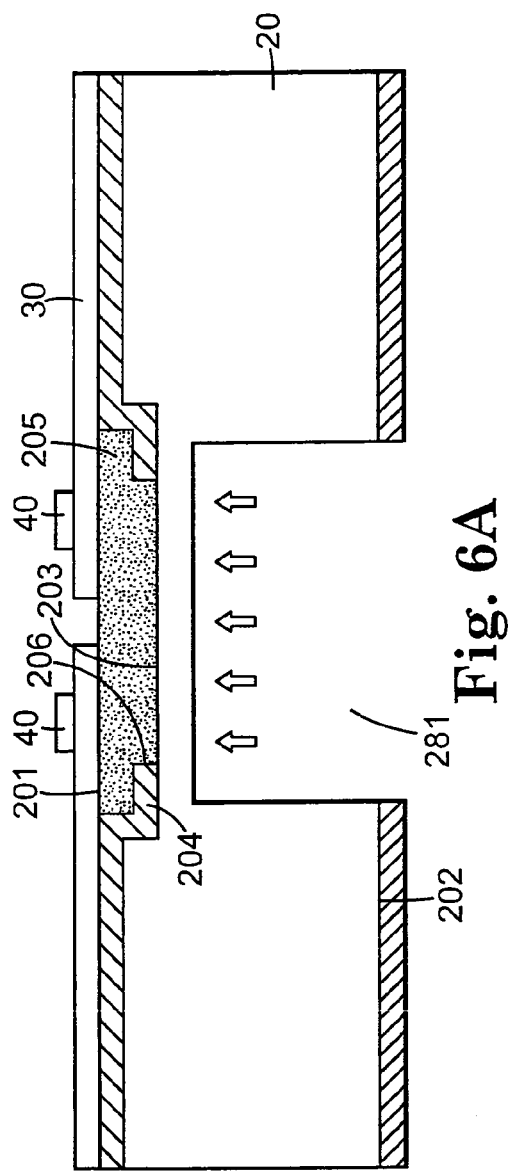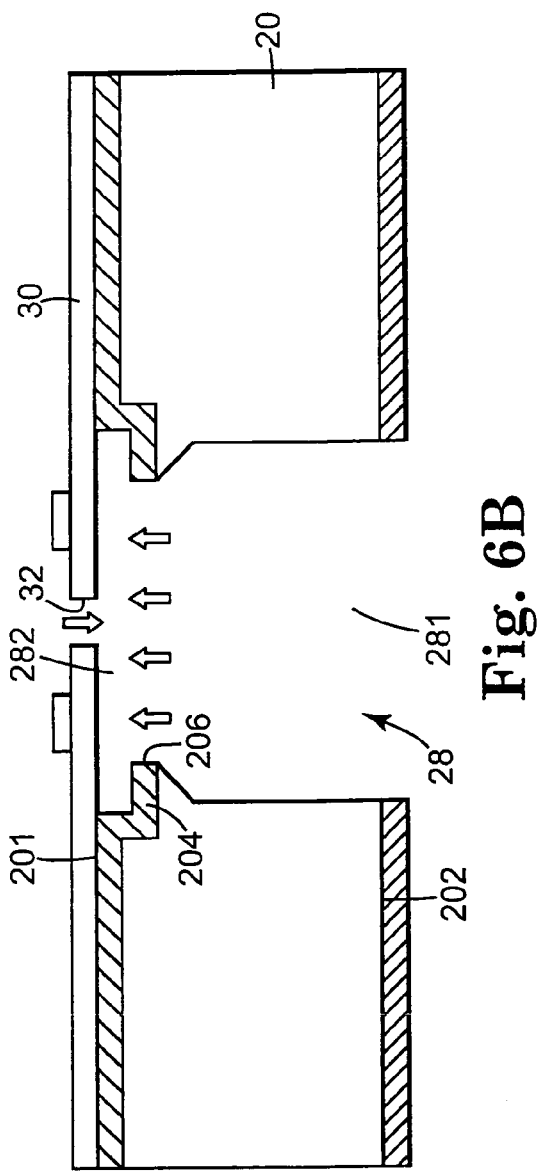

# FLEXTENSIONAL TRANSDUCER AND METHOD OF FORMING FLEXTENSIONAL TRANSDUCER

CROSS-REFERENCE TO RELATED APPLICATIONS

This application is a Divisional of U.S. patent application Ser. No. 10/348,384, filed on Jan. 21, 2003, now U.S. Pat. No. 6,883,903, which is incorporated herein by reference. This application is related to U.S. patent application Ser. No. 10/347,888, filed on Jan. 21, 2003, assigned to the assignee of the present invention, and incorporated herein by reference.

THE FIELD OF THE INVENTION

The present invention relates generally to flextensional transducers, and more particularly to a substrate for a flextensional transducer.

BACKGROUND OF THE INVENTION

Fluid drop ejectors have been developed for ejecting droplets of a flowable material. An example of a fluid drop ejector includes a flextensional transducer. As illustrated in FIGS. 1A and 1B, a conventional flextensional transducer 90 includes a body or substrate 92, a flexible membrane 94 having an orifice 96 defined therein, and an actuator 98. The substrate defines a reservoir for holding a supply of flowable material and the flexible membrane has a circumferential edge supported by the substrate. The actuator includes a piezoelectric material which deforms when an electrical voltage is applied. As such, when the piezoelectric material deforms, the flexible membrane deflects causing a quantity of flowable material to be ejected from the reservoir through the orifice.

One application of a flextensional transducer is in an inkjet printing system. As such, the inkjet printing system includes a printhead having a plurality of flextensional transducers that eject droplets of ink through orifices or nozzles to form an image on a print medium. Fluid or ink is delivered to each of the flextensional transducers through fluid channels formed in a substrate of the flextensional transducers. Existing methods for forming fluid channels in the substrate, however, are relatively slow and expensive, are difficult to control, and/or expose materials which are reactive with ink.

Accordingly, there is a desire for effectively forming a substrate for a flextensional transducer.

SUMMARY OF THE INVENTION

A method of forming an opening through a substrate having a first side and a second side opposite the first side includes forming a trench in the first side of the substrate, forming a mask layer within the trench, filling the trench with a fill material, forming a first portion of the opening in the substrate from the second side of the substrate toward the mask layer, and forming a second portion of the opening in the substrate through the mask layer and the fill material, including communicating the second portion of the opening with the first portion of the opening and the first side of the substrate.

BRIEF DESCRIPTION OF THE DRAWINGS

FIG. 2A is a schematic top view illustrating one embodiment of a plurality of flextensional transducers according to the present invention.

FIG. 2B is a schematic side view illustrating one embodiment of the plurality of flextensional transducers of FIG. 2A.

FIGS. 4A-4H illustrate one embodiment of forming a flextensional transducer according to the present invention.

FIGS. 5A-5F illustrate another embodiment of forming a flextensional transducer according to the present invention.

FIGS. 6A and 6B illustrate another embodiment of forming a flextensional transducer according to the present invention.

DESCRIPTION OF THE PREFERRED EMBODIMENTS

Figure 1A:
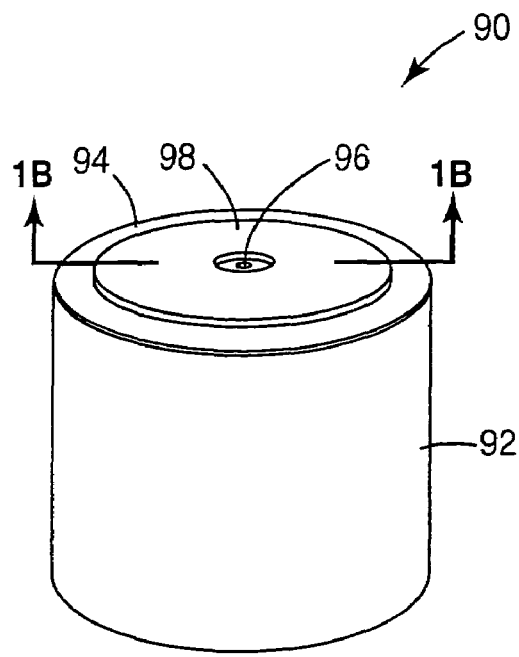
FIG. 1A is a perspective view of a portion of a prior art flextensional transducer.
Figure 1B:
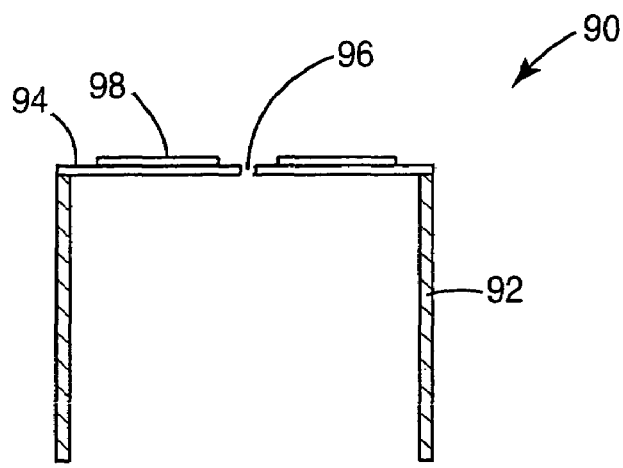
FIG. 1B is a cross-sectional view taken along line 1B-1B of FIG. 1A.

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 2A and 2B illustrate one embodiment of a plurality of flextensional transducers 10 arranged to form an array of flextensional transducers 10. Each flextensional transducer 10 is a fluid drop ejection device capable of ejecting droplets of a flowable material. Each flextensional transducer 10 may include drop-on-demand and/or continuous modes of operation. For clarity, the following description refers to the ejection of fluid from flextensional transducers 10. Fluid, as used herein, is defined to include any flowable material, including a liquid such as water, ink, blood, or photoresist and flowable particles of a solid such as talcum powder.

In one embodiment, each flextensional transducer 10 includes a supporting structure or substrate 20, a flexible membrane 30, and an actuator 40. While the plurality of flextensional transducers 10 are illustrated as being formed with a single substrate, it is understood that flextensional transducers 10 may be formed separately from each other with distinct substrates.

In one embodiment, substrate 20 has a plurality of fluid cavities 22 formed therein which communicate with a supply of fluid for flextensional transducers 10. When a plurality of flextensional transducers 10 are formed with a single substrate, substrate 20 has a fluid manifold or plenum 24 formed therein which distributes fluid to each flextensional transducer 10 and, more specifically, each fluid cavity 22 of a respective flextensional transducer 10. As such, fluid cavities 22 and fluid plenum 24 define a fluid passage or opening 28 through substrate 20. Preferably, each fluid cavity 22 is cylindrical in shape with an inlet of each fluid cavity 22 communicating with fluid plenum 24.

By forming flextensional transducers 10 with separate and distinct fluid cavities 22, fluidic cross-talk between fluid cavities 22 is avoided. While substrate 20 is illustrated as having an exterior profile which is rectangular in shape, it is understood that the exterior profile of substrate 20 may be other shapes such as round or square.

Figure 3A:
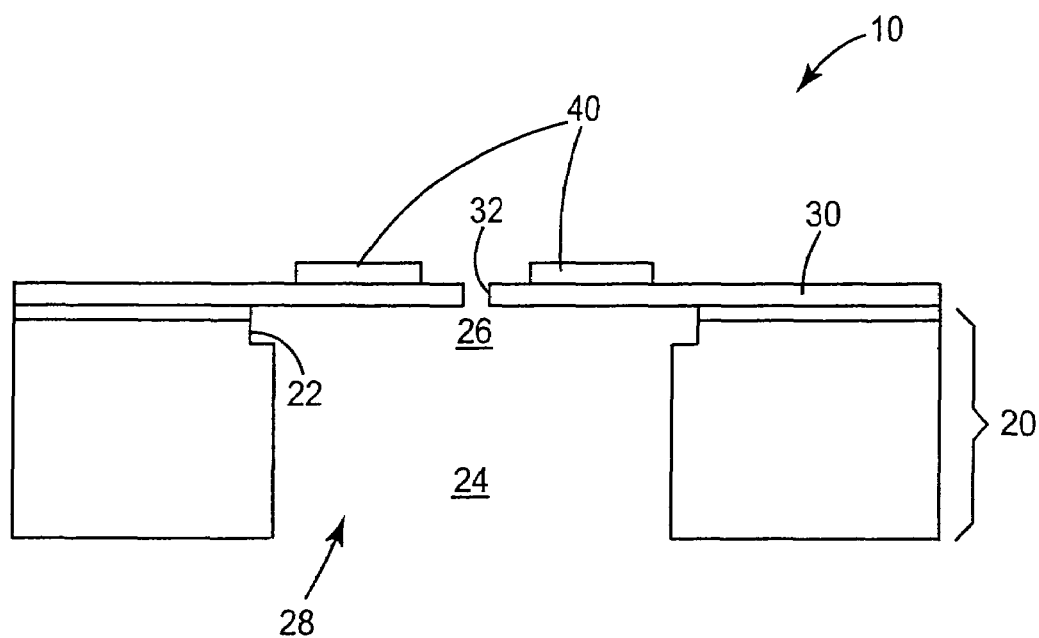
FIG. 3A is a schematic cross-sectional view from the perspective of line 3A-3A of FIG. 2A illustrating one embodiment of a flextensional transducer according to the present invention.

As illustrated in the embodiment of FIG. 3A, flexible membrane 30 is supported by substrate 20 and extends across or over fluid cavity 22 such that fluid cavity 22 and flexible membrane 30 define a fluid reservoir 26. As such, fluid reservoir 26 holds or contains fluid for flextensional transducer 10. As described below, deflection of flexible membrane 30 causes ejection of fluid from fluid reservoir 26.

Flexible membrane 30 has an orifice 32 defined therein which communicates with fluid cavity 22 and, more specifically, fluid reservoir 26. As such, when fluid cavity 22 is supplied with fluid, the fluid communicates with orifice 32. Orifice 32 defines a nozzle for ejecting a quantity of fluid from fluid cavity 22 in response to deflection of flexible membrane 30. In one embodiment, flexible membrane 30 is supported by substrate 20 such that a maximum deflection of flexible membrane 30 occurs at orifice 32 during a symmetric deflection mode. While flexible membrane 30 is illustrated as having one orifice 32, it is within the scope of the present invention for flexible membrane 30 to have one or more orifices 32 defined therein. Flexible membrane 30 is formed of a flexible material such as, for example, a flexible thin film of silicon nitride or silicon carbide, or a flexible thin layer of silicon.

Actuator 40 is associated with and causes deflection of flexible membrane 30. In the embodiment shown in FIG. 2A, actuator 40 is annular in shape and positioned symmetrically and, more specifically, concentrically with orifice 32. In another embodiment, actuator 40 is discontinuous, having multiple uncoupled sections positioned about orifice 32.

While fluid cavity 22, flexible membrane 30, and actuator 40 are illustrated as being circular in shape, it is within the scope of the present invention for fluid cavity 22, flexible membrane 30, and/or actuator 40 to be of other shapes such as square or rectangular with flexible membrane 30 being supported by substrate 20 on less than all sides.

In one embodiment, actuator 40 is provided and, more specifically, as described below, formed on a side of flexible membrane 30 opposite fluid cavity 22. As such, actuator 40 is not in direct contact with fluid contained within fluid cavity 22. Thus, potential effects of fluid contacting actuator 40, such as corrosion or electrical shorting, are reduced. In one embodiment, there is a passivation layer over electrodes for the actuator (although not shown in the drawings) that would substantially protect the electrodes from the environment, including mechanical and chemical (ink) affects. While actuator 40 is illustrated as being provided on a side of flexible membrane 30 opposite fluid cavity 22, it is also within the scope of the present invention for actuator 40 to be provided on a side of flexible membrane 30 facing fluid cavity 22.

In one embodiment, actuator 40 includes a piezoelectric material which changes shape, for example, expands and/or contracts, in response to an electrical signal. Thus, in response to the electrical signal, actuator 40 applies a force to flexible membrane 30 which causes flexible membrane 30 to deflect. As such, in this embodiment, orifice 32 is located in an area of flexible membrane 30 which achieves maximum deflection when flexible membrane 30 deflects. Examples of a piezoelectric material include zinc oxide or a piezoceramic material such as barium titanate, lead zirconium titanate (PZT), or lead lanthanum zirconium titanate (PLZT). It is understood that actuator 40 may include any type of device which causes movement or deflection of flexible membrane 30 including an electrostatic, magnetostatic, and/or thermal expansion actuator.

Figure 3B:
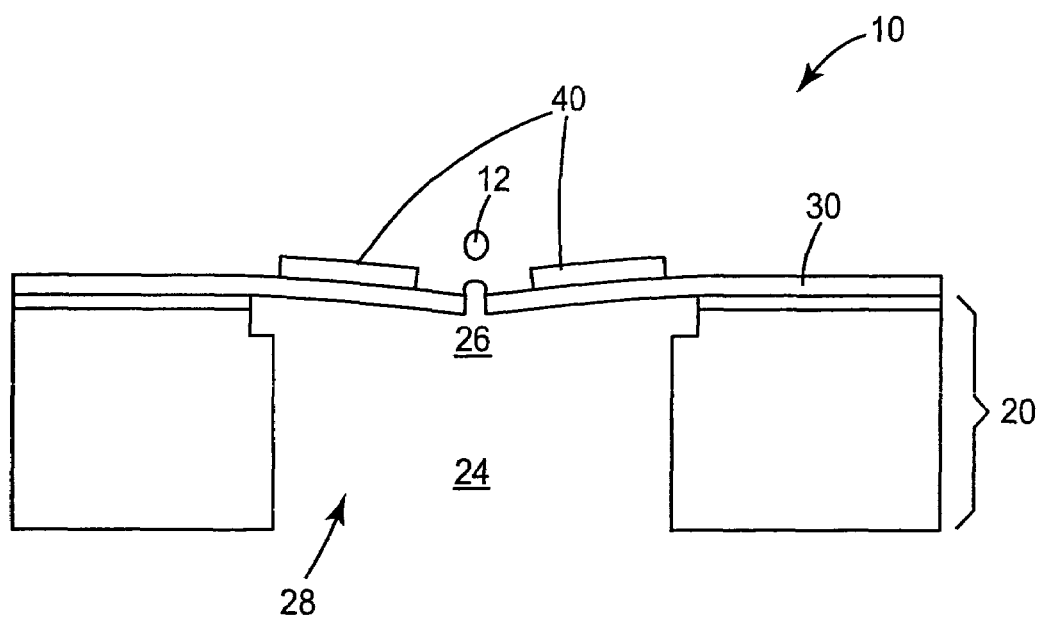
FIG. 3B is a schematic cross-sectional illustrating ejection of fluid from the flextensional transducer of FIG. 3A.

As illustrated in the embodiment of FIG. 3B, when flexible membrane 30 deflects, a droplet 12 of fluid is formed and ejected from orifice 32 of flextensional transducer 10. Since flexible membrane 30 is supported about a periphery thereof, the largest deflection of flexible membrane 30 occurs at or near orifice 32. It is understood that the extent of deflection of flexible membrane 30 illustrated in the embodiment of FIG. 3B has been exaggerated for clarity of the invention.

Cyclical application of an electrical signal to actuator 40 causes flexible membrane 30 to oscillate. Flexible membrane 30 has multiple resonant frequencies and, as such, may oscillate in different resonant vibrational modes. Preferably, flexible membrane 30 oscillates into a lowest order, symmetric resonant vibrational mode with maximum deflection occurring at orifice 32. Flextensional transducer 10, therefore, ejects droplets 12 of fluid at a predetermined rate and/or at predetermined intervals.

FIGS. 4A-4H illustrate one embodiment of forming flextensional transducer 10 including, more specifically, forming of opening 28 through substrate 20. In one embodiment, substrate 20 is a silicon substrate and opening 28 is formed in substrate 20 by chemical etching and/or laser machining (lasing), as described below. Substrate 20 has a first side 201 and a second side 202. Second side 202 is opposite of first side 201 and, in one embodiment, oriented substantially parallel with first side 201. Opening 28 communicates with first side 201 and second side 202 of substrate 20 so as to provide a channel or passage through substrate 20. While only one opening 28 is illustrated as being formed in substrate 20, it is understood that any number of openings 28 may be formed in substrate 20. In addition, while only one flextensional transducer 10 is illustrated as being formed, it is understood that multiple flextensional transducers 10 may be formed at the same time.

As illustrated in the embodiment of FIGS. 4A and 4B, before opening 28 is formed through substrate 20, a trench 203 is formed in substrate 20. In one embodiment, trench 203 is formed in substrate 20 by chemical etching into substrate 20, as described below.

In one embodiment, as illustrated in FIG. 4A, to form trench 203 in substrate 20, a masking layer 50 is formed on substrate 20. More specifically, masking layer 50 is formed on first side 201 of substrate 20. Masking layer 50 is used to selectively control or block etching of first side 201. As such, masking layer 50 is formed along first side 201 of substrate 20 and patterned to expose areas of first side 201 and define where trench 203 is to be formed in substrate 20.

In one embodiment, masking layer 50 is formed by deposition and patterned by photolithography and etching to define exposed portions of first side 201 of substrate 20. More specifically, masking layer 50 is patterned to outline where trench 203 (FIG. 4B) is to be formed in substrate 20 from first side 201. Preferably, trench 203 is formed in substrate 20 by chemical etching, as described below. Thus, masking layer 50 is formed of a material which is resistant to etchant used for etching trench 203 into substrate 20. Examples of a material suitable for masking layer 50 include silicon dioxide, silicon nitride, or any other suitable dielectric material, or photoresist or any other photoimageable material.

Next, as illustrated in the embodiment of FIG. 4B, trench 203 is formed in substrate 20. In one embodiment, trench 203 is formed in substrate 20 by etching into first side 201. Preferably, trench 203 is formed in substrate 20 using an anisotropic chemical etch process. In one embodiment, the etch process is a dry etch, such as a plasma based fluorine ($SF_6$) etch. In a particular embodiment, the dry etch is a reactive ion etch (RIE).

After trench 203 is formed in substrate 20, masking layer 50 is stripped or removed from substrate 20. As such, first side 201 of substrate 20 is revealed or exposed. In one embodiment, when masking layer 50 is formed of an oxide, masking layer 50 is removed, for example, by a chemical etch. In another embodiment, when masking layer 50 is formed of photoresist, masking layer 50 is removed, for example, by a resist stripper.

Figure 4C:
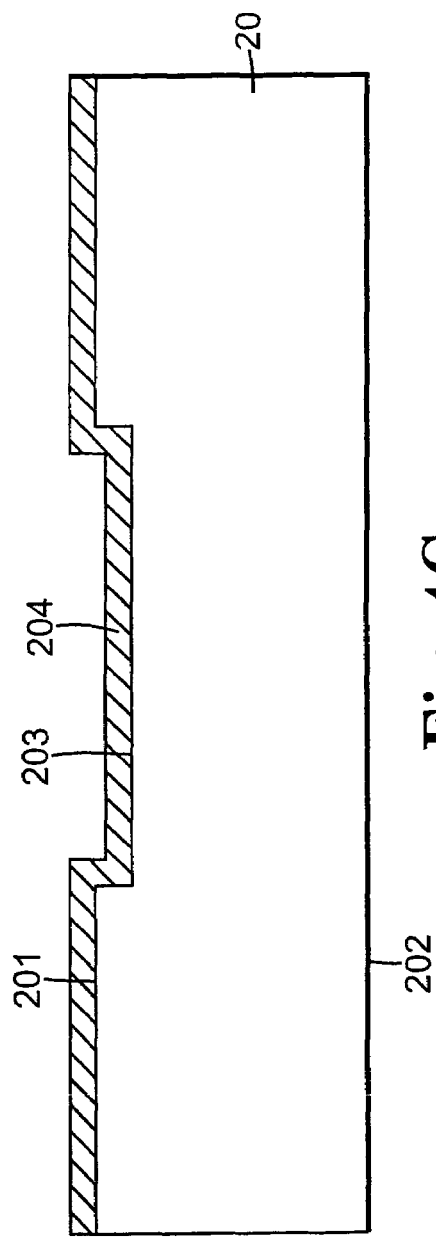

As illustrated in the embodiment of FIG. 4C, after trench 203 is formed in substrate 20 and masking layer 50 is removed from substrate 20, an embedded mask layer 204 is formed within trench 203 and on first side 201 of substrate 20. In one embodiment, embedded mask layer 204 is formed by growing an etch resistant material within trench 203 and on first side 201 of substrate 20. In another embodiment, embedded mask layer 204 is formed by depositing the etch resistant material within trench 203 and on first side 201 of substrate 20. The etch resistant material may include, for example, an oxide, a nitride, an oxynitride, silicon carbide, or any other suitable deposited or thermally grown film.

Figure 4D:
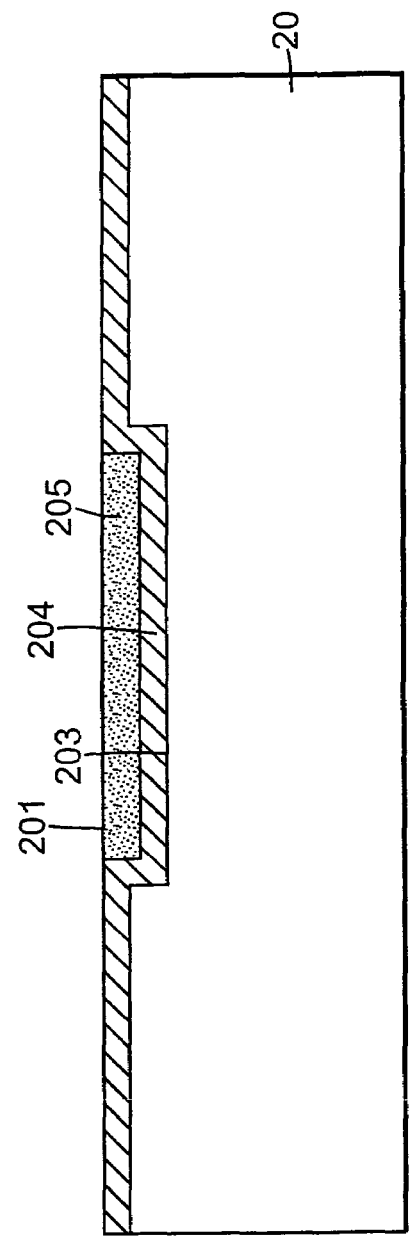

Next, as illustrated in the embodiment of FIG. 4D, trench 203 is filled. Trench 203 is filled by depositing a fill material 205 over first side 201 of substrate 20 and embedded mask layer 204 so as to fill trench 203. Fill material 169 may include, for example, an amorphous material, an amorphous silicon material, or a polycrystalline silicon material.

In one embodiment, after fill material 205 is deposited within trench 203, fill material 205 is planarized to create a substantially flat surface. More specifically, fill material 205 is planarized so as to redefine first side 201 of substrate 20. In one embodiment, fill material 205 is planarized by a chemical mechanical polishing (CMP) or resist etch back process.

As illustrated in the embodiment of FIG. 4E, after fill material 205 is deposited within trench 203 and planarized to create a substantially flat surface, flexible membrane 30 is formed on substrate 20. More specifically, flexible membrane 30 is formed on first side 201 of substrate 20 over embedded mask layer 204 and fill material 205. Flexible membrane 30 is formed, for example, as a flexible thin film of silicon nitride or silicon carbide, or a flexible thin layer of silicon.

Also, as illustrated in the embodiment of FIG. 4E, actuator 40 is formed on flexible membrane 30 and nozzle or orifice 32 is formed in flexible membrane 30. In one embodiment, actuator 40 includes a piezoelectric material such as zinc oxide (ZnO) or a piezoceramic material such as barium titanate, lead zirconium titanate (PZT), or lead lanthanum zirconium titanate (PLZT). Actuator 40 may include one or more layers of material and may be formed by vapor deposition, sputtering, electron beam evaporation, and/or other deposition techniques. Orifice 32 is formed in flexible membrane 30 by, for example, etching through flexible membrane 30. Actuator 40 and orifice 32 are patterned, for example, by selectively masking flexible membrane 30.

As illustrated in the embodiment of FIG. 4E, a masking layer 52 is formed on second side 202 of substrate 20. Masking layer 52 is patterned to expose an area of second side 202 and define where substrate 20 is to be etched to form a first portion 281 of opening 28 (FIGS. 4F-4H).

Next, as illustrated in the embodiment of FIG. 4F, first portion 281 of opening 28 is etched into substrate 20 from second side 202. As such, first portion 281 of opening 28 is formed by etching an exposed portion or area of substrate 20 from second side 202 toward first side 201. In one embodiment, etching into substrate 20 from second side 202 toward first side 201 continues until first portion 281 of opening 28 is formed to embedded mask layer 204. When etching first portion 281 of opening 28 into substrate 20 from second side 202, embedded mask layer 204 acts as an etch stop layer which limits or establishes a depth of first portion 281. As such, in one embodiment, forming of first portion 281 proceeds to embedded mask layer 204.

Preferably, first portion 281 of opening 28 is formed in substrate 20 using an anisotropic chemical etch process. In one embodiment, the etch process forms first portion 281 with substantially parallel sides. In one embodiment, the etch process is a dry etch, such as a plasma based fluorine ($SF_6$) etch. In a particular embodiment, the dry etch is a reactive ion etch (RIE) and, more specifically, a deep (RIE) (DRIE). In another embodiment, first portion 281 of opening 28 is formed in substrate 20 by a laser machining process.

During the deep RIE, an exposed section is alternatively etched with a reactive etching gas and coated, until a hole is formed. In one exemplary embodiment, the reactive etching gas creates a fluorine radical that chemically and/or physically etches the material. In this exemplary embodiment, a polymer coating that is selective to the etchant used is deposited on inside surfaces of the forming hole, including the sidewalls and bottom. The coating is created by using carbon-fluorine gas that deposits $(CF_2)_n$, a Teflon-like material or Teflon-producing monomer, on these surfaces. In this embodiment, the polymer substantially prevents etching of the sidewalls during the subsequent etch(es). The gases for the etchant alternate with the gases for forming the coating on the inside of the hole.

As illustrated in the embodiment of FIG. 4G, after first portion 281 of opening 28 is formed, a second portion 282 of opening 28 is formed in substrate 20. In one embodiment, second portion 282 is etched into substrate 20 and, more specifically, into fill material 205 from first side 201 of substrate 20 through orifice 32 of flexible membrane 30. Etching into substrate 20 from first side 201 continues through fill material 205 to embedded mask layer 204. In one embodiment, the etch process is a wet etch and uses a wet anisotropic etchant such as tetra-methyl ammonium hydroxide (TMAH), potassium hydroxide (KOH), or other alkaline etchant.

Next, as illustrated in the embodiment of FIG. 4H, second portion 282 of opening 28 is completed by etching through embedded mask layer 204. As such, second portion 282 of opening 28 communicates with first portion 281. Thus, opening 28 is formed through substrate 20 and flexible membrane 30 is suspended from substrate 20 across opening 28.

In one embodiment, embedded mask layer 204 is removed with an isotropic chemical etch process. In one embodiment, the etch process is a wet etch, such as a buffered oxide etch (BOE). In another embodiment, the etch process is a dry etch, such as a plasma-based fluorine ($SF_6$) etch. In a particular embodiment, the dry etch is a reactive ion etch (RIE) from second side 202.

By forming embedded mask layer 204 in substrate 20, a multi-step etching process can be used to form opening 28 through substrate 20. More specifically, a first etching process can be used to form first portion 281 of opening 28 and a second etching process can be used to form second portion 282 of opening 28. In one embodiment, first portion 281 of opening 28 is formed with a dimension D1 and second portion 282 of opening 28 is formed with a dimension D2. In one illustrative embodiment, dimension D1 is in a range of approximately 50 microns to approximately 200 microns, and dimension D2 is between approximately 10 microns to approximately 25 microns greater than dimension D1.

Preferably, dimension D1 is less than dimension D2 such that formation of first portion 281 of opening 28 is within dimension D2 of second portion 282. As such, dimensions of fluid feed hole or cavity 22 are defined by second portion 282. Thus, dimensions of fluid feed hole or cavity 22, for example, in both mean diameter and shape or location relative to opening 28 and/or orifice 32, are more accurate compared to using a one-step etching process to form opening 28 from the backside of substrate 20 all the way to flexible membrane 30 since dimensions of opening 28 at first side 201 are controlled by embedded mask layer 204.

FIGS. 5A-5F illustrate another embodiment of forming opening 28 through substrate 20. As illustrated in the embodiment of FIGS. 5A and 5B, after trench 203 is formed in substrate 20 and embedded mask layer 204 is formed within trench 203, one or more holes 206 are formed in embedded mask layer 204. Holes 206 are formed in embedded mask layer 204 using photolithography and etching techniques. In one embodiment, holes 206 are patterned in embedded mask layer 204 within trench 203 so as to form a particle trapping feature, as described below.

Next, as illustrated in the embodiment of FIG. 5C, after holes 206 are formed in embedded mask layer 204, trench 203 is filled. Trench 203 is filled by depositing fill material 205 over first side 201 of substrate 20 and embedded mask layer 204 so as to fill trench 203. Fill material 205 is disposed within trench 203 so as to fill holes 206 of embedded mask layer 204. As described above, after fill material 205 is deposited within trench 203, fill material 205 is planarized to create a substantially flat surface and redefine first side 201 of substrate 20.

As illustrated in the embodiment of FIG. 5D, after fill material 205 is deposited within trench 203 and planarized to create a substantially flat surface, flexible membrane 30 is formed on first side 201 of substrate 20, as described above. In addition, actuator 40 is formed on flexible membrane 30 and orifice 32 is formed in flexible membrane 30, also as described above. Furthermore, masking layer 52 is formed on second side 202 of substrate 20 and patterned to define where substrate 20 is to be etched to form first portion 281 of opening 28 (FIGS. 5E and 5F).

Next, as illustrated in the embodiment of FIG. 5E, first portion 281 of opening 28 is etched into substrate 20 from second side 202. As such, first portion 281 of opening 28 is formed by etching an exposed portion or area of substrate 20 from second side 202 toward first side 201. In one embodiment, etching into substrate 20 from second side 202 toward first side 201 continues to embedded mask layer 204 and through holes 206.

As illustrated in the embodiment of FIG. 5F, after first portion 281 of opening 28 is formed, second portion 282 of opening 28 is formed in substrate 20. In one embodiment, second portion 282 is etched into substrate 20 and, more specifically, into fill material 205 from first side 201 through orifice 32 of flexible membrane 30 and second side 202 through holes 206 in embedded mask layer 204. In one embodiment, the etch process is a wet etch and uses a wet anisotropic etchant such as tetra-methyl ammonium hydroxide (TMAH), potassium hydroxide (KOH), or other alkaline etchant or xenon di-fluoride ($XeF_2$). As such, opening 28 is formed through substrate 20 and flexible membrane 30 is suspended from substrate 20 across opening 28.

By forming holes 206 in embedded mask layer 204, embedded mask layer 204 forms a particle trapping feature for flextensional transducer 10. More specifically, holes 206 are spaced to allow fluid to flow through embedded mask layer 204 and into first portion 281 of opening 28 while preventing foreign particles from flowing into first portion 281. Such particles include, for example, dust particles and fibers. Such particles, if allowed to enter first portion 281, may affect a performance of flextensional transducer 10 by, for example, blocking, either wholly or partially, orifice 32. In addition, holes 206 can also be designed to provide variable or tuned reverse-flow resistance, similar to a check valve but still allowing some flow toward second side 202, thereby increasing the energy coupled from the transducer to ink droplet 12 (FIG. 3B).

FIGS. 6A and 6B illustrate another embodiment of forming opening 28 through substrate 20. As illustrated in the embodiment of FIG. 6A, embedded mask layer 204 is patterned so as to have hole 206 formed therein. As such, embedded mask layer 204 creates a self-alignment structure, as described below. Fill material 205 is disposed within trench 203 of substrate 20, and flexible membrane 30 and actuator 40 are formed, as described above.

As illustrated in the embodiment of FIG. 6A, first portion 281 of opening 28 is etched into substrate 20 from second side 202. As such, first portion 281 of opening 28 is formed by etching an exposed portion or area of substrate 20 from second side 202 toward first side 201. In one embodiment, etching into substrate 20 from second side 202 toward first side 201 is stopped before reaching embedded mask layer 204. In one embodiment, the etch process is a dry etch, such as a plasma-based fluorine ($SF_6$) etch. In a particular embodiment, the dry etch is a reactive ion etch (RIE) and, more specifically, a deep (RIE) (DRIE), as described above.

Next, as illustrated in the embodiment of FIG. 6B, first portion 281 of opening 28 is completed and second portion 282 of opening 28 is formed in substrate 20. In one embodiment, first portion 281 of opening 28 is completed and second portion 282 of opening 28 is formed by etching into substrate 20 from first side 201 through orifice 32 of flexible membrane 30 and from second side 202 through hole 206 in embedded mask layer 204. More specifically, second portion 282 is etched into substrate 20 and, more specifically, into fill material 205 from first side 201 through orifice 32 of flexible membrane 30 and from second side 202 through hole 206 in embedded mask layer 204. As such, fill material 205 is substantially removed from trench 203. Thus, opening 28 is formed through substrate 20 and flexible membrane 30 is suspended from substrate 20 across opening 28.

In one embodiment, the etch process is a wet etch and uses a wet anisotropic etchant such as tetra-methyl ammonium hydroxide (TMAH), potassium hydroxide (KOH), or other alkaline etchant. As such, embedded mask layer 204 acts as an etch stop which causes etching of first portion 281 to self-terminate. More specifically, when etching of first portion 281 reaches hole 206 of embedded mask layer 204, etching of first portion 281 follows the crystalline orientation or crystalline planes of substrate 20. For example, in one embodiment, etching of first portion 281 follows <111> Si planes of substrate 20. As such, when etching of first portion 281 reaches hole 206 of embedded mask layer 204, etching continues along <111> Si planes of substrate 20 such that etching of first portion 281 substantially self-terminates.

Figure 7A:
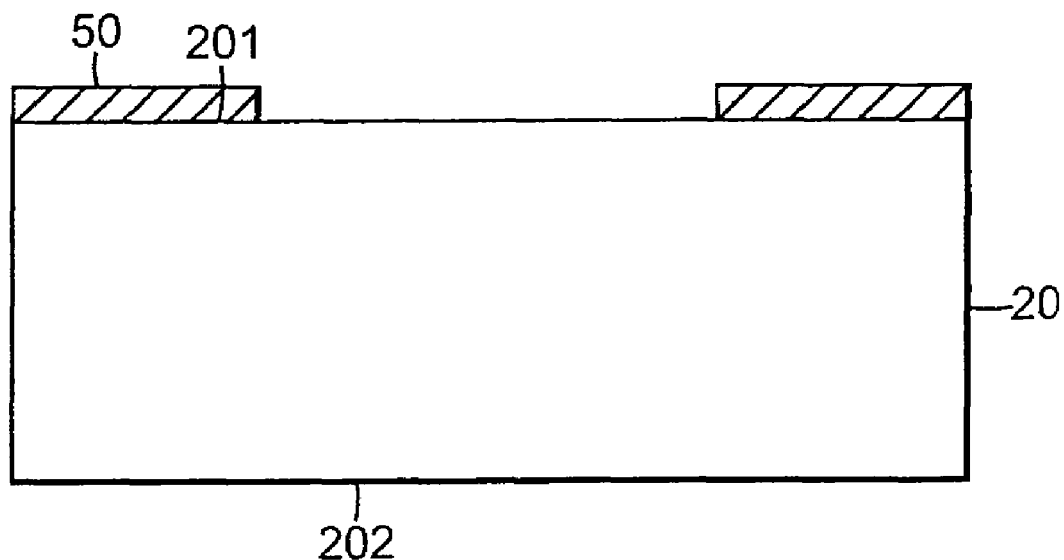
FIGS. 7A-7E illustrate another embodiment of forming a flextensional transducer according to the present invention.

FIGS. 7A-7E illustrate another embodiment of forming a flextensional transducer 10' including, more specifically, forming of opening 28 through substrate 20. As illustrated in the embodiment of FIG. 7A, before opening 28 is formed through substrate 20, masking layer 50 is formed on substrate 20. More specifically, masking layer 50 is formed on first side 201 of substrate 20 and patterned to expose areas of first side 201 and define where opening 28 is to communicate with first side 201 of substrate 20. In one embodiment, masking layer 50 is formed by deposition and patterned by photolithography and etching to define exposed portions of first side 201 of substrate 20, as described above. An example of a material suitable for masking layer 50 includes silicon nitride.

Figure 7B:
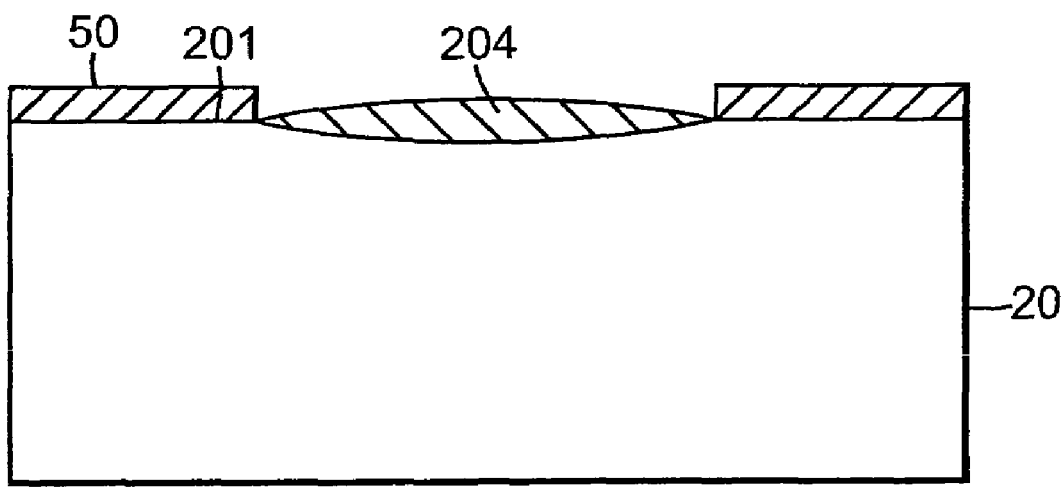

Next, as illustrated in the embodiment of FIG. 7B, embedded mask layer 204 is formed in substrate 20. More specifically, embedded mask layer 204 is formed in first side 201 of substrate 20. In one embodiment, embedded mask layer 204 is formed by growing an oxide on and/or in first side 201 of substrate 20. In the illustrated embodiment, mask layer 204 is formed by growing an oxide in first side 201 and on first side 201 of substrate 20. As such, in this embodiment, mask layer 204 has a curved profile above the surface of substrate 20. It is understood that the extent of curvature illustrated in the drawings is exaggerated for clarity of the invention. The oxide is resistant to at least one particular type of etchant used on substrate 20 and may include, for example, silicon dioxide ($SiO_2$) or, preferably, field oxide (FOX).

Figure 7C:
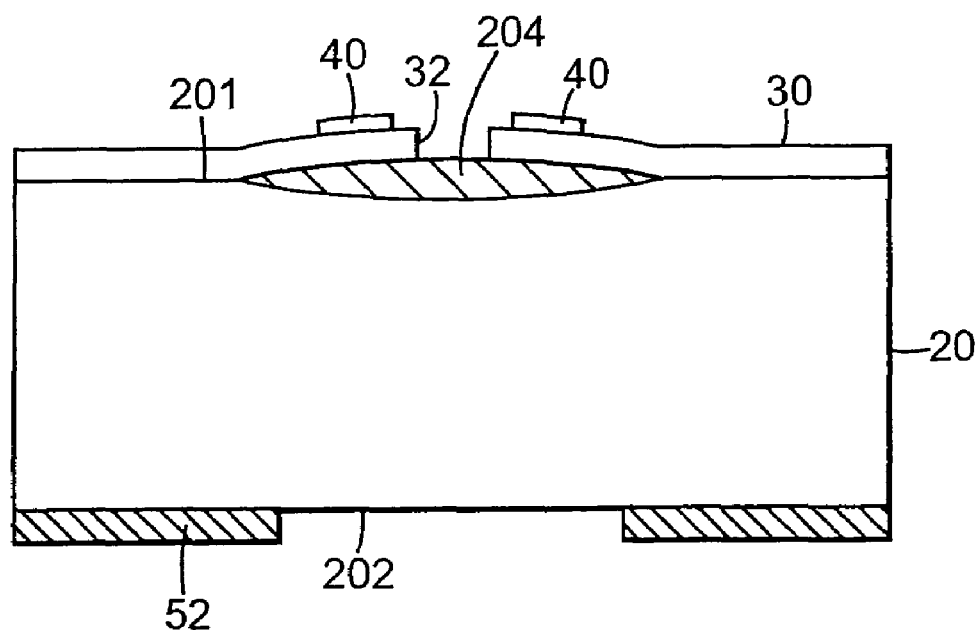

As illustrated in the embodiment of FIG. 7C, after embedded mask layer 204 is formed in first side 201 and masking layer 50 is removed from first side 201, flexible membrane 30 is formed on first side 201 over embedded mask layer 204. More specifically, flexible membrane 30 is formed on first side 201 directly over embedded mask layer 204. As mask layer 204 of the illustrated embodiment has a curved profile, flexible membrane 30, in this embodiment, also has a curved profile. Actuator 40 is formed on flexible membrane 30 and orifice 32 is formed in flexible membrane 30, as described above. Furthermore, masking layer 52 is formed on second side 202 of substrate 20 and patterned to define where substrate 20 is to be etched to form first portion 281 of opening 28 (FIGS. 7D and 7E).

Figure 7D:
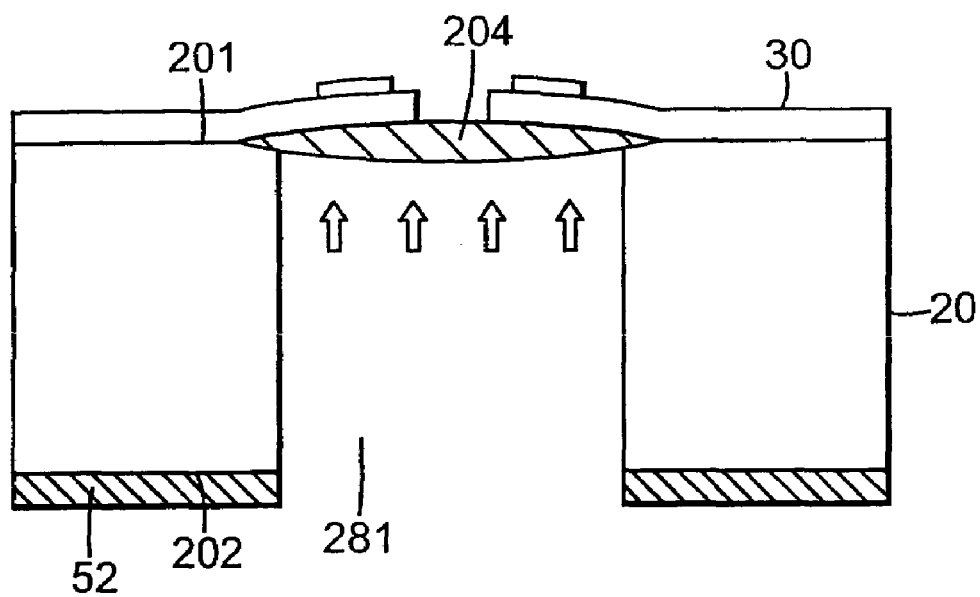

Next, as illustrated in the embodiment of FIG. 7D, first portion 281 of opening 28 is etched into substrate 20 from second side 202. As such, first portion 281 of opening 28 is formed by etching an exposed portion or area of substrate 20 from second side 202 toward first side 201. In one embodiment, etching into substrate 20 from second side 202 toward first side 201 continues until first portion 281 of opening 28 is formed to embedded mask layer 204. In one embodiment, the etch process forms first portion 281 with substantially parallel sides. In one embodiment, the etch process is a dry etch, such as a plasma based fluorine ($SF_6$) etch. In a particular embodiment, the dry etch is a reactive ion etch (RIE) and, more specifically, a deep (RIE) (DRIE), as described above.

Figure 7E:
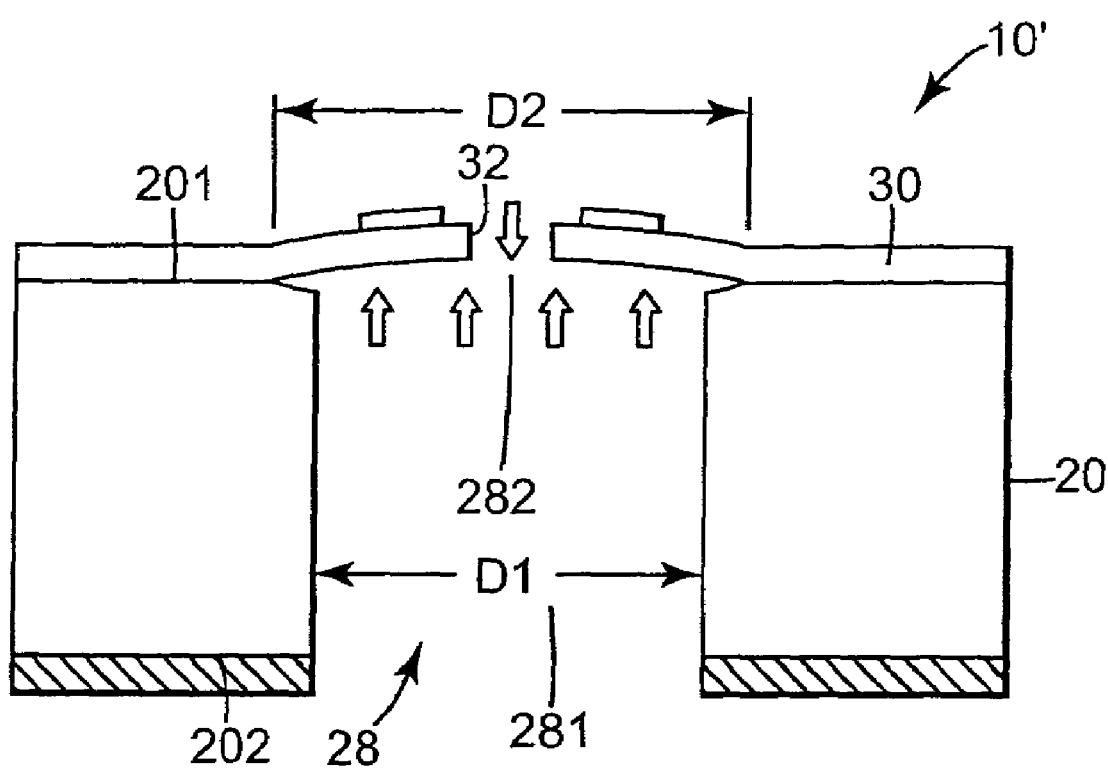

As illustrated in the embodiment of FIG. 7E, after first portion 281 of opening 28 is formed, second portion 282 of opening 28 is formed in substrate 20. In one embodiment, second portion 282 is etched into substrate 20 and, more specifically, into embedded mask layer 204 from first side 201 of substrate 20 through orifice 32 of flexible membrane 30 and from second side 202 of substrate 20 through first portion 281. As such, embedded mask layer 204 is substantially removed. Thus, opening 28 is formed through substrate 20 and flexible membrane 30 is suspended from substrate 20 across opening 28. As illustrated in this embodiment, flexible membrane 30 retains the curved profile of embedded mask layer 204.

In one embodiment, the etch process is an isotropic wet etch process such as a buffered oxide etch (BOE) which substantially removes embedded mask layer 204. In one embodiment, first portion 281 of opening 28 is formed with a dimension D1 and second portion 282 of opening 28 is formed with a dimension D2. Preferably, dimension D1 is less than dimension D2 such that formation of first portion 281 is within dimension D2 of second portion 282, as described above. In one illustrative embodiment, dimension D1 is in a range of approximately 50 microns to approximately 200 microns, and dimension D2 is between approximately 10 microns to approximately 25 microns greater than dimension D1.

Figure 8:
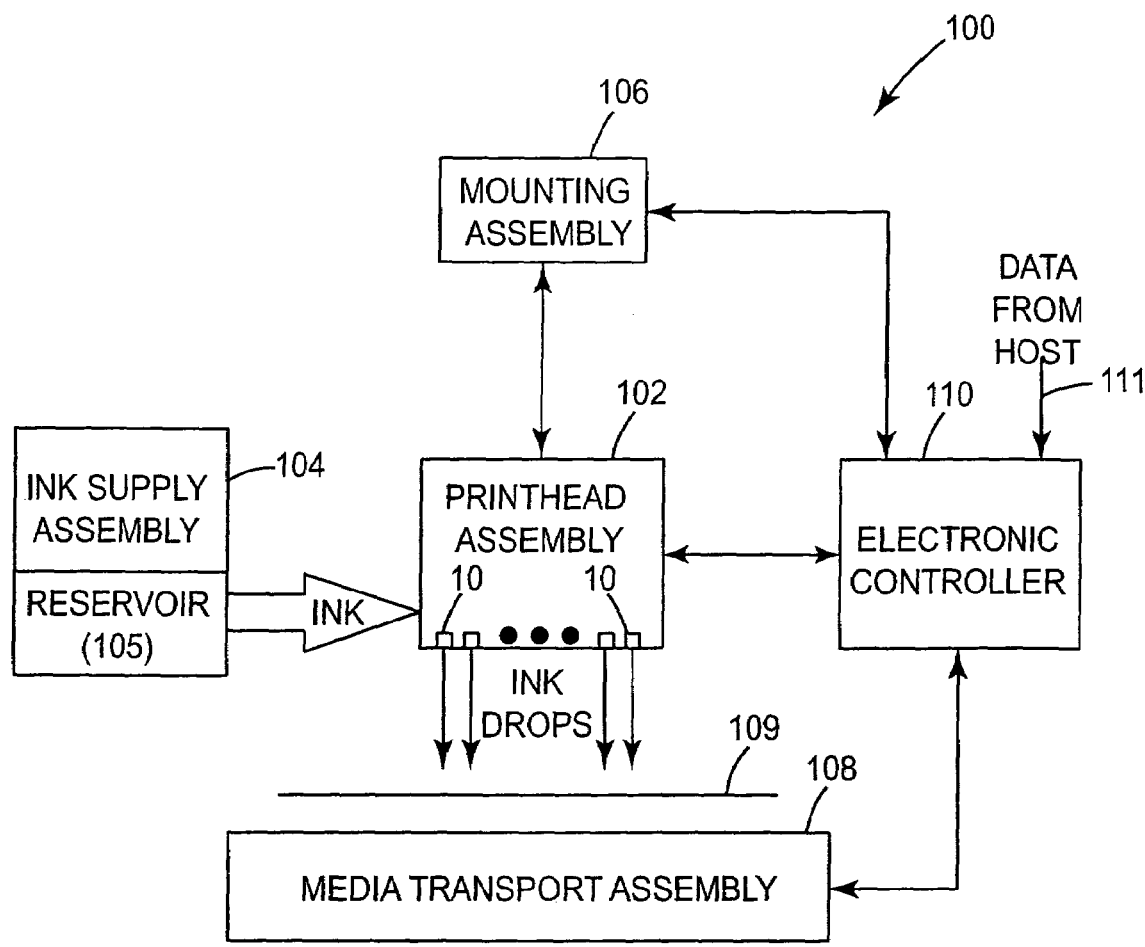
FIG. 8 is a block diagram illustrating one embodiment of an inkjet printing system including a plurality of flextensional transducers according to the present invention.

FIG. 8 illustrates one embodiment of an inkjet printing system 100 according to the present invention. Inkjet printing system 100 includes an inkjet printhead assembly 102, an ink supply assembly 104, a mounting assembly 106, a media transport assembly 108, and an electronic controller 110. Inkjet printhead assembly 102 includes one or more printheads each including a plurality of flextensional transducers 10 which eject drops of ink onto a print medium 109. Print medium 109 is any type of suitable sheet material, such as paper, card stock, transparencies, and the like.

Typically, flextensional transducers 10 are arranged in one or more columns or arrays. As such, properly sequenced ejection of ink from flextensional transducers 10 can cause characters, symbols, and/or other graphics or images to be printed upon print medium 109 as inkjet printhead assembly 102 and print medium 109 are moved relative to each other. In one embodiment, individual flextensional transducers 10 may be provided for ejection of fluids with different properties such as inks of different colors.

Ink supply assembly 104 supplies ink to inkjet printhead assembly 102 and includes a reservoir 105 for storing ink. As such, ink flows from reservoir 105 to inkjet printhead assembly 102 and, more specifically, to fluid reservoir 26 of flextensional transducers 10. In one embodiment, inkjet printhead assembly 102 and ink supply assembly 104 are housed together in an inkjet cartridge or pen. In another embodiment, ink supply assembly 104 is separate from inkjet printhead assembly 102 and supplies ink to inkjet printhead assembly 102 through an interface connection, such as a supply tube. In either embodiment, reservoir 105 of ink supply assembly 104 may be removed, replaced, and/or refilled.

Mounting assembly 106 positions inkjet printhead assembly 102 relative to media transport assembly 108 and media transport assembly 108 positions print medium 109 relative to inkjet printhead assembly 102. In one embodiment, inkjet printhead assembly 102 is a scanning type printhead assembly. As such, mounting assembly 106 includes a carriage for moving inkjet printhead assembly 102 relative to media transport assembly 108 to scan print medium 109. In another embodiment, inkjet printhead assembly 102 is a non-scanning type printhead assembly. As such, mounting assembly 106 fixes inkjet printhead assembly 102 at a prescribed position relative to media transport assembly 108. Thus, media transport assembly 108 positions print medium 109 relative to inkjet printhead assembly 102.

Electronic controller 110 communicates with inkjet printhead assembly 102, mounting assembly 106, and media transport assembly 108. Electronic controller 110 receives data 111 from a host system, such as a computer, and includes memory for temporarily storing data 111. Typically, data 111 is sent to inkjet printing system 100 along an electronic, infrared, optical or other information transfer path. Data 111 represents, for example, a document and/or file to be printed. As such, data 111 forms a print job for inkjet printing system 100 and includes one or more print job commands and/or command parameters.

In one embodiment, electronic controller 110 provides control of inkjet printhead assembly 102 including timing control for ejection of ink drops from flextensional transducers 10. As such, electronic controller 110 defines a pattern of ejected ink drops which form characters, symbols, and/or other graphics or images on print medium 109. Timing control and, therefore, the pattern of ejected ink drops, is determined by the print job commands and/or command parameters.

While the above description refers to inclusion of flextensional transducers 10 in an inkjet printing system 100, it is understood that flextensional transducers 100, may be incorporated into other fluid ejection systems including non-printing applications or systems such as a medical nebulizer. In addition, while the above description refers to ejection of fluid or ink from flextensional transducers 10, it is understood that any flowable material, including a liquid such as photoresist or flowable particles such as talcum powder or a powdered drug, may be ejected from flextensional transducers 10.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of forming an opening through a substrate having a first side and a second side opposite the first side, the method comprising:
    forming a trench in the first side of the substrate;
    forming a mask layer within the trench;
    completely filling in the trench with a fill material;
    forming a first portion of the opening in the substrate from the second side of the substrate toward the mask layer; and
    forming a second portion of the opening in the substrate through the mask layer and the fill material, including communicating the second portion of the opening with the first portion of the opening and the first side of the substrate; and
    further comprising:
    before filling the trench, forming at least one hole in the mask layer,
    wherein filling the trench further includes filling the at least one hole in the mask layer with the fill material, and wherein forming the second portion of the opening in the substrate includes removing the fill material within the at least one hole and forming the second portion of the opening through the at least one hole in the mask layer.

2. The method of claim 1, wherein forming the at least one hole in the mask layer includes patterning the mask layer.

3. The method of claim 2, wherein patterning the mask layer includes forming a particle trapping feature.

4. The method of claim 1, wherein forming the at least one hole in the mask layer includes forming a self-alignment structure.

5. A method of forming a flextensional transducer, the method comprising:
    forming a trench in a first side of a substrate;
    forming a mask layer along a bottom of the trench;
    filling the trench with a fill material, including embedding the mask layer as formed along the bottom of the trench, the fill material being distinct from the mask layer;
    forming a flexible membrane with an orifice therein on the first side of the substrate over the fill material and the mask layer;
    forming a first portion of an opening in the substrate from a second side of the substrate opposite the first side toward the mask layer; and
    forming a second portion of the opening in the substrate through the mask layer and the fill material, including communicating the second portion of the opening with the first portion of the opening and the first side of the substrate and communicating the orifice of the flexible membrane with the opening.

6. The method of claim 5, wherein the substrate is formed of silicon.

7. The method of claim 5, wherein forming the trench in the first side of the substrate includes etching into the substrate from the first side.

8. The method of claim 5, wherein forming the mask layer within the trench includes at least one of growing and depositing an etch resistant material within the trench.

9. The method of claim 8, wherein the etch resistant material includes one of an oxide, a nitride, an oxynitride, and silicon carbide.

10. The method of claim 5, wherein filling the trench includes redefining the first side of the substrate.

11. The method of claim 5, wherein the fill material includes one of an amorphous material, an amorphous silicon material, and a polycrystalline silicon material.

12. The method of claim 5, wherein forming the first portion of the opening in the substrate includes forming the first portion of the opening to the mask layer.

13. The method of claim 5, wherein forming the first portion of the opening in the substrate includes one of etching and laser machining into the substrate.

14. The method of claim 13, wherein forming the second portion of the opening in the substrate includes etching into the substrate.

15. The method of claim 5, wherein forming the first portion of the opening in the substrate and forming the second portion of the opening in the substrate includes forming the first portion of the opening with a first dimension and forming the second portion of the opening with a second dimension, wherein the first dimension is less than the second dimension.

16. A method of forming a flextensional transducer, the method comprising:
  forming a trench in a first side of a substrate;
  forming a mask layer along a bottom of the trench;
  filling the trench with a fill material, including embedding the mask layer as formed along the bottom of the trench;
  forming a flexible membrane with an orifice therein on the first side of the substrate over the fill material and the mask layer;
  forming a first portion of an opening in the substrate from a second side of the substrate opposite the first side toward the mask layer; and
  forming a second portion of the opening in the substrate through the mask layer and the fill material, including communicating the second portion of the opening with the first portion of the opening and the first side of the substrate and communicating the orifice of the flexible membrane with the opening; and
  further comprising:
  before filling the trench, forming at least one hole in the mask layer as formed along the bottom of the trench,
  wherein filling the trench further includes filling the at least one hole in the mask layer with the fill material, and wherein forming the second portion of the opening in the substrate includes removing the fill material within the at least one hole and forming the second portion of the opening through the at least one hole in the mask layer.

17. The method of claim 16, wherein forming the at least one hole in the mask layer includes patterning the mask layer.

18. The method of claim 17, wherein patterning the mask layer includes forming a particle trapping feature.

19. The method of claim 16, wherein forming the at least one hole in the mask layer includes forming a self-alignment structure.

20. A method of forming a flextensional transducer, the method comprising:
  forming a mask layer in a first side of a substrate, including forming the mask layer with a curved profile extended above a surface of the first side of the substrate;
  forming a flexible membrane with an orifice therein on the first side of the substrate over the mask layer, including forming the flexible membrane with the curved profile of the mask layer;
  forming a first portion of an opening in the substrate from a second side of the substrate to the mask layer; and
  forming a second portion of the opening in the substrate through the mask layer, including communicating the second portion of the opening with the first portion of the opening and communicating the orifice of the flexible membrane with the opening.

21. The method of claim 20, wherein forming the mask layer in the first side of the substrate includes growing an etch resistant material in the first side of the substrate.

22. The method of claim 21, wherein forming the mask layer further includes growing the etch resistant material on the first side of the substrate and forming the mask layer with the curved profile.

23. The method of claim 20, wherein forming the flexible membrane on the first side of the substrate includes directly forming the flexible membrane over the mask layer.

24. The method of claim 20, wherein forming the first portion of the opening in the substrate includes etching into the substrate from the second side.

25. The method of claim 20, wherein forming the second portion of the opening in the substrate includes etching through the mask layer.

26. The method of claim 20, wherein forming the second portion of the opening in the substrate includes substantially removing the mask layer.

27. The method of claim 20, wherein forming the second portion of the opening in the substrate includes supporting the flexible membrane from the first side of the substrate.

28. The method of claim 20, wherein forming the first portion of the opening in the substrate includes forming the first portion of the opening with a first dimension, wherein forming the second portion of the opening in the substrate includes forming the second portion of the opening with a second dimension, and wherein the first dimension is less than the second dimension.

29. The method of claim 20, further comprising:
  forming an actuator adapted to deflect the flexible membrane on the flexible membrane.

30. The method of claim 20, wherein the substrate is formed of silicon.

* * * * *

UNITED STATES PATENT AND TRADEMARK OFFICE
CERTIFICATE OF CORRECTION

| | | |
|---|---|---|
| PATENT NO. | : 7,378,030 B2 | Page 1 of 1 |
| APPLICATION NO. | : 11/041773 | |
| DATED | : May 27, 2008 | |
| INVENTOR(S) | : Martha A. Truninger et al. | |

It is certified that error appears in the above-identified patent and that said Letters Patent is hereby corrected as shown below:

In column 11, line 32, delete "100," and insert -- 10 --, therefor.

Signed and Sealed this

Twenty-ninth Day of July, 2008

JON W. DUDAS
*Director of the United States Patent and Trademark Office*